US012741749B2

(12) United States Patent
Terwilliger et al.

(10) Patent No.: US 12,741,749 B2
(45) Date of Patent: Sep. 22, 2026

(54) SYSTEM FOR SUPERCONDUCTING ELECTRONICS IN AEROSPACE APPLICATIONS

(71) Applicant: RTX Corporation, Farmington, CT (US)

(72) Inventors: Neil J. Terwilliger, Cheshire, CT (US); Charles E. Lents, Amston, CT (US); Zubair A. Baig, South Windsor, CT (US); Haralambos Cordatos, Colchester, CT (US); Joseph B. Staubach, Colchester, CT (US); Malcolm P. MacDonald, Bloomfield, CT (US)

(73) Assignee: RTX CORPORATION, Farmington, CT (US)

( * ) Notice: Subject to any disclaimer, the term of this patent is extended or adjusted under 35 U.S.C. 154(b) by 0 days.

(21) Appl. No.: 18/933,016

(22) Filed: Oct. 31, 2024

(65) Prior Publication Data

US 2025/0051028 A1 Feb. 13, 2025

Related U.S. Application Data

(62) Division of application No. 17/669,955, filed on Feb. 11, 2022, now Pat. No. 12,162,619.

(51) Int. Cl.

| | |
|---|---|
| ***B64D 33/08*** | (2006.01) |
| ***B64D 27/34*** | (2024.01) |
| ***H05K 7/20*** | (2006.01) |

(52) U.S. Cl.

CPC ............ *B64D 33/08* (2013.01); *B64D 27/34* (2024.01); *H05K 7/20372* (2013.01); *B64D 2221/00* (2013.01)

(58) Field of Classification Search

CPC .... B64D 33/08; B64D 27/34; B64D 2221/00; H05K 7/20372

See application file for complete search history.

(56) References Cited

U.S. PATENT DOCUMENTS

| | | | |
|---|---|---|---|
| 9,321,538 B2 | 4/2016 | Edwards | |
| 11,371,431 B1 * | 6/2022 | Dyson, Jr. ................. | F02K 5/00 |

(Continued)

FOREIGN PATENT DOCUMENTS

| | | |
|---|---|---|
| DE | 102017223803 A1 | 6/2019 |
| FR | 3110895 A1 | 12/2021 |

(Continued)

OTHER PUBLICATIONS

European Extended Search Report for European Application No. 23156146.5, dated Jun. 16, 2023, 9 pages.

(Continued)

*Primary Examiner* — William L Gmoser

(74) *Attorney, Agent, or Firm* — CANTOR COLBURN LLP

(57) ABSTRACT

A powertrain system of an aircraft includes one or more electrical components to provide electrical power to one or more electrical loads of the aircraft. The system further includes a rechargeable cryogenic heat sink containing a volume of cryogenic cooling material. The cryogenic heat sink is configured to cool the one or more electrical components. A method of operating a powertrain system of an aircraft includes generating thermal energy at one or more electrical components of the powertrain system, fluidly connecting a cryogenic heat sink to the one or more electrical components, and cooling the one or more electrical components via a volume of cryogenic cooling material of the cryogenic heat sink.

16 Claims, 3 Drawing Sheets

(56) References Cited

U.S. PATENT DOCUMENTS

| | | | | |
|---|---|---|---|---|
| 2013/0082518 | A1* | 4/2013 | Edwards | E02D 27/425 307/9.1 |
| 2013/0255281 | A1 | 10/2013 | Bray | |
| 2014/0182264 | A1 | 7/2014 | Weisgerber et al. | |
| 2015/0251561 | A1* | 9/2015 | Konigorski | B64F 1/0299 244/100 R |
| 2017/0233111 | A1* | 8/2017 | Mata | H01M 8/04014 244/171.1 |
| 2019/0009917 | A1* | 1/2019 | Anton | B64D 35/024 |
| 2019/0066878 | A1 | 2/2019 | Arndt | |
| 2019/0128570 | A1 | 5/2019 | Moxon | |
| 2019/0293346 | A1 | 9/2019 | Schwarz et al. | |
| 2020/0091810 | A1* | 3/2020 | Miller | H02K 7/1807 |
| 2021/0300575 | A1 | 9/2021 | Staubach et al. | |
| 2021/0381429 | A1 | 12/2021 | Taylor | |
| 2022/0231551 | A1 | 7/2022 | Kupiszewski et al. | |
| 2023/0257131 | A1 | 8/2023 | Terwilliger et al. | |
| 2023/0391466 | A1* | 12/2023 | Steiner | B64D 37/005 |
| 2024/0271833 | A1* | 8/2024 | Minas | B64D 37/30 |

FOREIGN PATENT DOCUMENTS

| | | | |
|---|---|---|---|
| GB | 2548123 | A | 9/2017 |
| WO | 2020148524 | A1 | 7/2020 |
| WO | 2021063638 | A1 | 4/2021 |

OTHER PUBLICATIONS

Extended European Search Report for EP Application No. 26166204.3; Issue date, Jun. 8, 2026, 8 pages.

* cited by examiner

SYSTEM FOR SUPERCONDUCTING ELECTRONICS IN AEROSPACE APPLICATIONS

CROSS-REFERENCE TO RELATED APPLICATIONS

This application is a division of U.S. application Ser. No. 17/669,955 filed Feb. 11, 2022, the disclosure of which is incorporated herein by reference in its entirety.

BACKGROUND

Exemplary embodiments of the present disclosure pertain to the art of aircraft, and in particular to electronics and propulsion systems for aircraft.

Electric powertrains for aircraft offer the potential for the introduction of new power sources and propulsion configurations to the aircraft, such as fuel cell systems and distributed propulsion systems. There are, however, significant difficulties with large scale distribution of electric power onboard aircraft. Losses of 10% of the transmitted energy to heat and the increased drag associated with rejecting the heat eliminates most or all of the available system benefits. Increasing voltage improves transmission efficiency, but partial discharge mitigation requirements increase with the increase in voltage. Superconduction would enable lower distribution voltages and reduce the energy lost in transmission by an order of magnitude, and could allow architectures that rely heavily on electric power distribution and distributed propulsion. However, systems for creating superconducting temperatures, typically less than 70 degrees K, are most often heavy and power intensive.

BRIEF DESCRIPTION

In one embodiment, a powertrain system of an aircraft includes one or more electrical components to provide electrical power to one or more electrical loads of the aircraft. The system further includes a rechargeable cryogenic heat sink containing a volume of cryogenic cooling material. The cryogenic heat sink is configured to cool the one or more electrical components.

Additionally or alternatively, in this or other embodiments the volume of cryogenic cooling material is one or more of a hydrogen, helium, neon, nitrogen material.

Additionally or alternatively, in this or other embodiments the volume of cryogenic material is at a heat sink temperature lower than a superconducting temperature of the one or more electrical components.

Additionally or alternatively, in this or other embodiments the cryogenic heat sink is connected to the one or more electrical components via in intermediate cooling loop carrying an intermediate cooling fluid.

Additionally or alternatively, in this or other embodiments the volume of cryogenic material exchanges thermal energy with an intermediate cooling fluid at an intermediate heat exchanger.

Additionally or alternatively, in this or other embodiments the volume of cryogenic material is a primary propulsion fuel of the aircraft.

Additionally or alternatively, in this or other embodiments the one or more electrical components include one or more of an electrical generator, a rectifier, an inverter, and an electric motor.

Additionally or alternatively, in this or other embodiments the cryogenic heat sink undergoes a phase change while absorbing heat from the electrical components.

In another embodiment, a propulsion system of an aircraft includes one or more power units to generate electrical energy utilizing a flow of fuel. One or more propulsion units are operably connected to and driven by the electrical energy. One or more electrical components are operably connected to the one or more power units and/or the one or more propulsion units. The propulsion system further includes a rechargeable cryogenic heat sink containing a volume of cryogenic cooling material. The cryogenic heat sink is configured to cool the one or more electrical components to cool the one or more electrical components.

Additionally or alternatively, in this or other embodiments the volume of cryogenic material is one or more of a hydrogen, helium, neon, nitrogen material.

Additionally or alternatively, in this or other embodiments the volume of cryogenic material is at a heat sink temperature lower than a superconducting temperature of the one or more electrical components.

Additionally or alternatively, in this or other embodiments the cryogenic heat sink is connected to the one or more electrical components via in intermediate cooling loop carrying an intermediate cooling fluid.

Additionally or alternatively, in this or other embodiments the volume of cryogenic material exchanges thermal energy with an intermediate cooling fluid at an intermediate heat exchanger.

Additionally or alternatively, in this or other embodiments the volume of cryogenic material is a fuel source of the flow of fuel.

In yet another embodiment, a method of operating a powertrain system of an aircraft includes generating thermal energy at one or more electrical components of the powertrain system, fluidly connecting a cryogenic heat sink to the one or more electrical components, and cooling the one or more electrical components via a volume of cryogenic cooling material of the cryogenic heat sink.

Additionally or alternatively, in this or other embodiments the cryogenic heat sink is periodically recharged.

Additionally or alternatively, in this or other embodiments the recharging occurs when the aircraft is on the ground.

Additionally or alternatively, in this or other embodiments thermal energy is exchanged between the volume of cryogenic material and an intermediate cooling fluid circulated through an intermediate cooling loop. Thermal energy is exchanged between the intermediate cooling fluid and the one or more electrical components to cool the one or more electrical components.

Additionally or alternatively, in this or other embodiments the volume of cryogenic material is a primary propulsion fuel of the aircraft.

Additionally or alternatively, in this or other embodiments the volume of cryogenic material is at a heat sink temperature lower than a superconducting temperature of the one or more electrical components.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
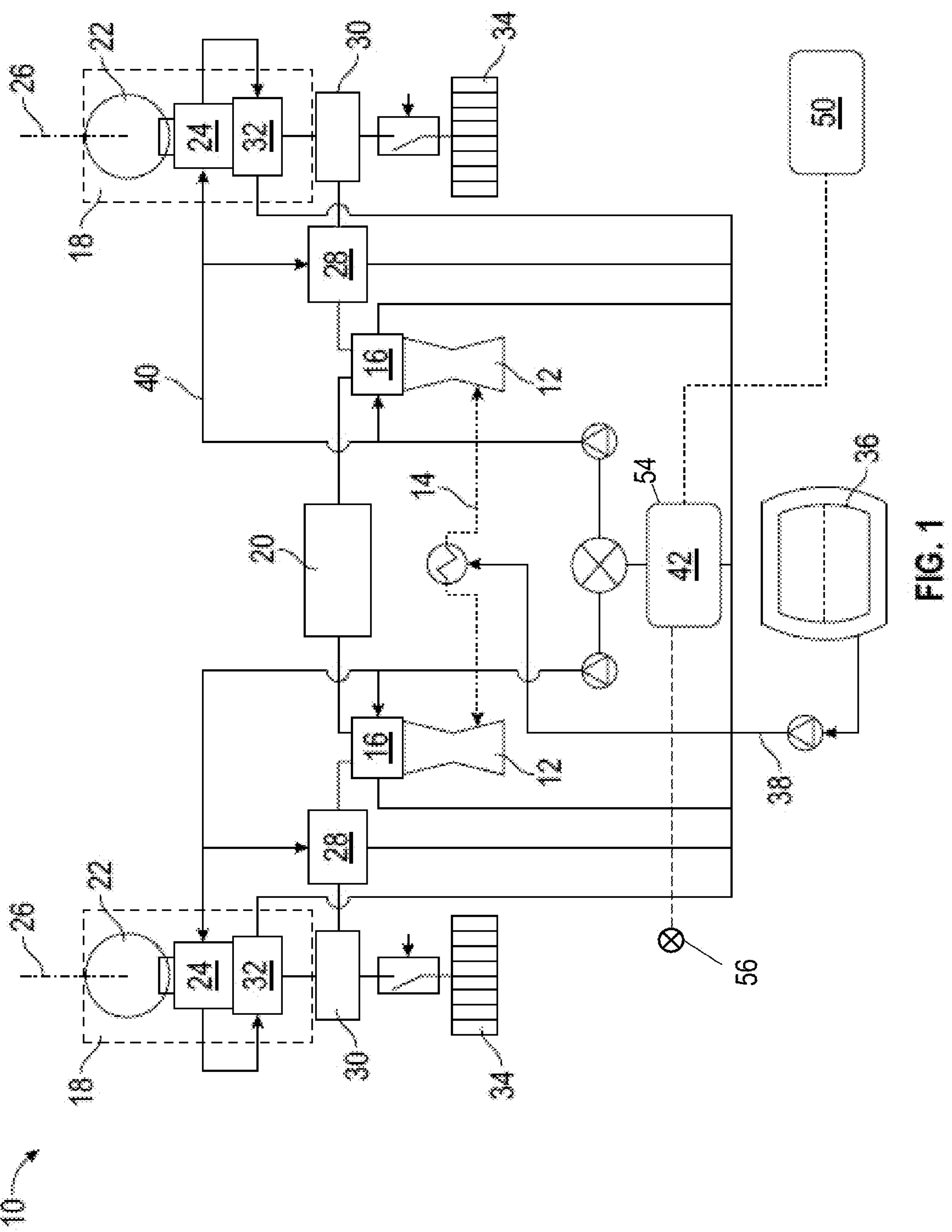
FIG. 1 is a schematic illustration of an embodiment of a powertrain of an aircraft.

Referring to FIG. 1, illustrated is a schematic of an exemplary powertrain system 10 for an aircraft. The system 10 includes one or more power units 12, which utilize a flow of fuel 14. The flow of fuel 14 is fed to the power units 12 from a fuel source 36 along a fuel line 38. In some embodiments the fuel is a cryogenic fuel, such as liquid hydrogen. The power units 12 are connected to an electrical generator 16, which convert, for example, rotational energy from the power unit 12 to electrical energy. The power units 12 are connected to a propulsion unit 18 and/or one or more electrical loads 20, such as control systems, environmental control systems, navigation systems, or other loads.

The propulsion unit 18 includes, for example, a fan 22 driven by an electric motor 24, which utilizes electrical energy from the electrical generator 16 to drive the electric motor 24. The fan 22 is driven about a fan axis 26 by the electric motor 24 to generate thrust for propulsion of the aircraft. In some embodiments, the electrical generator 16 is connected to the propulsion unit 18 by a rectifier 28, and a power panel 30. The power panel 30 selectably directs electrical energy to the propulsion unit 18 via an inverter 32, or to an energy storage system 34, such as one or more batteries, depending on requirements of the system 10. Additionally, when the power panel 30 may selectably direct electrical energy from the energy storage system 34 to the electric motor 24 when, for example, the power units 12 are not operating or are operating at a lower load than required by the electric motor 24. In some embodiments, the electrical components, such as the generator 16, the rectifier 28, the inverter 32, and/or the electric motor 24, use superconducting materials and may achieve a rating of, for example, 5 to 10 megawatts or more.

The electrical components in the powertrain system 10 require cooling to maintain the temperatures required for superconducting performance. The system 10 utilizes a cryogenic cooling material having a phase change below superconducting temperatures in order to cool the electrical components. In some embodiments, the cryogenic materials may include one or more of hydrogen, helium, neon, nitrogen, or blends thereof. It is to be appreciated that these materials are merely exemplary, and that other materials may be utilized. In some embodiments, such as shown in FIG. 1, a cooling loop 40 circulates the cryogenic cooling material directly through the electrical components such as the generator 16, the rectifier 28, the inverter 32, and/or the electric motor 24 from a cryogenic sink 42, which in some embodiments is an insulated tank 54 in which the cryogenic cooling material is stored in liquid form and/or slush, or partially solid, form. As the cryogenic cooling material is circulated through the electrical components, the cryogenic cooling material undergoes a phase change to gaseous form by absorbing thermal energy from the electrical components before being returned to the insulated tank 54. Excess gaseous cryogenic material may be removed from the insulated tank 54 via a vent 56, which may exit the aircraft at, for example, a wingtip or other location. The vent 56 may be utilized when, for example, a pressure of the gaseous cryogenic material in the insulated tank 54 reaches a threshold pressure.

The cryogenic cooling material is at a pressure such that the phase change occurs under the superconducting temperature, and thus the cryogenic sink 42 can absorb a large amount of thermal energy without changing a temperature of the cold sink 42. In some embodiments, the cryogenic cooling material is stored in the cold sink 42 at a pressure of 3 atmospheres or less and at a temperature in the range of 14 to 24 degrees Kelvin. This boiling of the cryogenic cooling material below the superconducting temperature results in a relatively low volume of cryogenic cooling material compared to a cryogenic sink at which the phase change occurs at a temperature greater than the superconducting temperature.

The cryogenic sink 42 is replenishable or rechargeable when the aircraft is on the ground, such as at a gate prior to departure such that an anticipated needed volume of cryogenic cooling material is onboard the aircraft for each flight of the aircraft. The cryogenic sink 42 may be recharged using ground-based equipment 50. Recharging may include exchanging of the cryogenic sink 42 material or re-cooling of the cryogenic sink 42 material, either in place or after removal of the cryogenic sink 42 from the aircraft. In some embodiments, the expended cryogenic material is expelled from the aircraft, either in flight or when the aircraft is returned to the ground, and the cryogenic sink 42 is then refilled, while in other embodiments the ground-based equipment 50 cools the cryogenic sink 42 in place on the aircraft. In some embodiments, the flow of cryogenic material to the electrical components is selectably switchable via, for example, one or more valves. This allows the flow of cryogenic material to be modulated to the electrical components based on cooling needs of the electrical components in order to maintain the superconducting temperature, and also in the case of when a supply of cryogenic material is diminished allowing maintaining the superconducting temperature of selected electrical components, while reducing the cooling of other electrical components, such as for example, the inverter 32 or rectifier 28.

Figure 2:
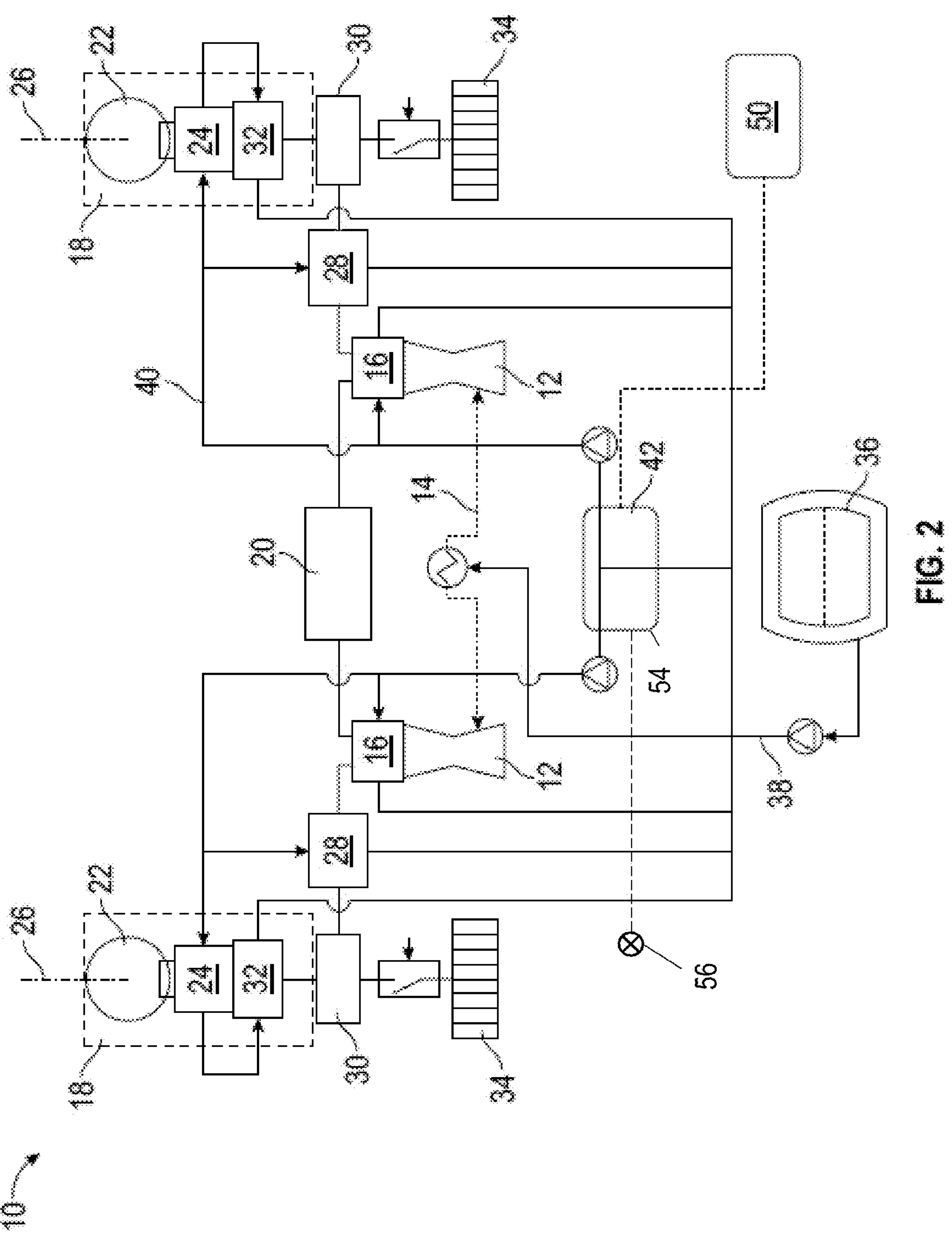
FIG. 2 is a schematic illustration of another embodiment of a powertrain of an aircraft.

In other embodiments, such as in FIG. 2, an intermediate cooling fluid, such as helium or the like, is circulated between the cryogenic sink 42 and the electrical components. The intermediate cooling fluid is circulated through the electrical components via the cooling loop 40, and rejects the thermal energy at a cryogenic sink 42. As the intermediate cooling fluid is circulated through the electrical components, the intermediate cooling fluid undergoes a phase change to gaseous form by absorbing thermal energy from the electrical components. The intermediate cooling fluid is then recirculated through the cryogenic sink 42, with the absorbed thermal energy being rejected to the cryogenic sink and returning the intermediate cooling fluid to liquid state. In some embodiments, the intermediate cooling fluid is maintained at a temperature in the range of 18 to 24 degrees Kelvin and a pressure of about 10 bar in order to provide the desired cooling of the superconducting electrical components.

In some embodiments, the flow of intermediate cooling fluid to the electrical components is selectably switchable via, for example, one or more valves. This allows the flow of intermediate cooling fluid to be modulated to the electrical components based on cooling needs of the electrical components in order to maintain the superconducting temperature, and also in the case of when a supply of cryogenic material is diminished allowing maintaining the superconducting temperature of selected electrical components, while reducing the cooling of other electrical components, such as for example, the inverter 32 or rectifier 28.

Figure 3:
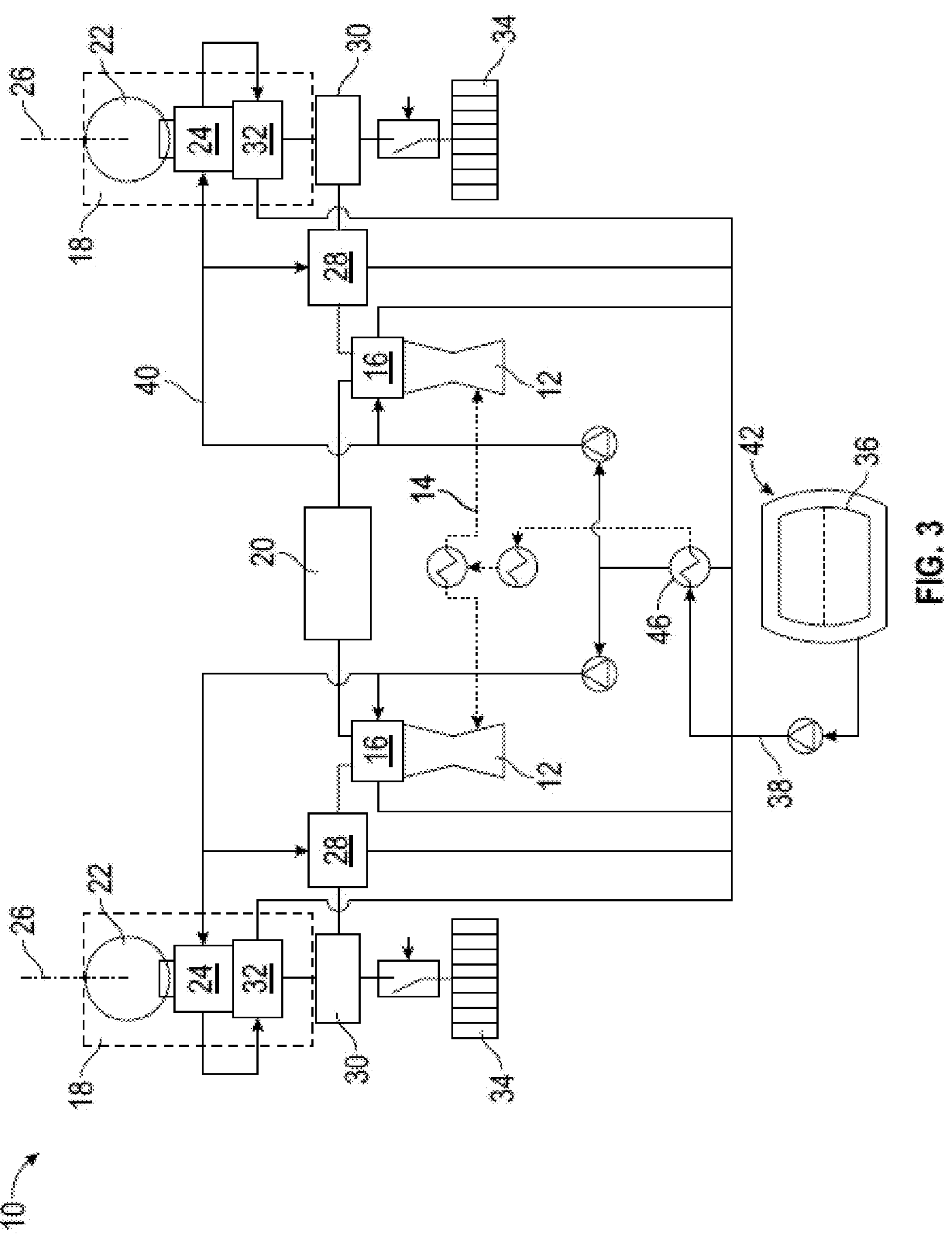
FIG. 3 is a schematic illustration of yet another embodiment of a powertrain of an aircraft.

In another embodiment, such as illustrated in FIG. 3, the cryogenic material is the flow of fuel and the cryogenic sink is the fuel source 36. As the flow of fuel is directed to the power units 12 along the fuel line 38, the flow of fuel is directed through an intermediate heat exchanger 46 where the flow of fuel exchanges thermal energy with the intermediate cooling fluid circulating through the cooling loop 40. In one embodiment, the flow of fuel is hydrogen, which is directed from the fuel source 36 in the liquid phase, and changes phase to gas at the intermediate heat exchanger 46 due to the exchange of thermal energy with the intermediate cooling fluid. The flow of fuel is then utilized by the power generator 12, which is connected to the electrical generator 16 to provide electrical energy to the propulsion unit 18 and/or to the one or more electrical loads 20.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A powertrain system of an aircraft, comprising:

one or more electrical components to provide electrical power to one or more electrical loads of the aircraft, the one or more electrical components requiring cooling to maintain temperatures required for superconducting performance of the one or more electrical components; and a rechargeable cryogenic heat sink containing a volume of cryogenic cooling material, the cryogenic heat sink configured to cool the one or more electrical components;

wherein the volume of cryogenic material exchanges thermal energy with an intermediate cooling fluid at an intermediate heat exchanger;

wherein the intermediate cooling fluid is directed to the one or more electrical components to cool the one or more electrical components; and wherein the volume of cryogenic cooling material is configured to boil at a temperature below the superconducting temperature of the one or more electrical components.

2. The powertrain system of claim 1, wherein the volume of cryogenic cooling material is one or more of a hydrogen, helium, neon, nitrogen material.

3. The powertrain system of claim 1, wherein the volume of cryogenic material is at a heat sink temperature lower than a superconducting temperature of the one or more electrical components.

4. The powertrain system of claim 1, wherein the cryogenic heat sink is connected to the one or more electrical components via a cooling loop carrying the intermediate cooling fluid.

5. The powertrain system of claim 1, wherein the volume of cryogenic material is a primary propulsion fuel of the aircraft.

6. The powertrain system of claim 1, wherein the one or more electrical components include one or more of an electrical generator, a rectifier, an inverter, and an electric motor.

7. A propulsion system of an aircraft, comprising:

one or more power units to generate electrical energy utilizing a flow of fuel;

one or more propulsion units operably connected to and driven by the electrical energy;

one or more electrical components operably connected to the one or more power units and/or the one or more propulsion units, the one or more electrical components requiring cooling to maintain temperatures required for superconducting performance of the one or more electrical components; and a rechargeable cryogenic heat sink containing a volume of cryogenic cooling material, the cryogenic heat sink configured to cool the one or more electrical components;

wherein the volume of cryogenic material exchanges thermal energy with an intermediate cooling fluid at an intermediate heat exchanger;

wherein the intermediate cooling fluid is directed to the one or more electrical components to cool the one or more electrical components; and wherein the volume of cryogenic cooling material is configured to boil at a temperature below the superconducting temperature of the one or more electrical components.

8. The propulsion system of claim 7, wherein the volume of cryogenic material is one or more of a hydrogen, helium, neon, nitrogen material.

9. The propulsion system of claim 7, wherein the volume of cryogenic material is at a heat sink temperature lower than a superconducting temperature of the one or more electrical components.

10. The propulsion system of claim 7, wherein the cryogenic heat sink is connected to the one or more electrical components via a cooling loop carrying the intermediate cooling fluid.

11. The propulsion system of claim 8, wherein the volume of cryogenic material is a fuel source of the flow of fuel.

12. A method of operating a powertrain system of an aircraft, comprising:

generating thermal energy at one or more electrical components of the powertrain system, the one or more electrical components requiring cooling to maintain temperatures required for superconducting performance of the one or more electrical components;

fluidly connecting a cryogenic heat sink to an intermediate heat exchanger;

exchanging thermal energy at the intermediate heat exchanger between a volume of cryogenic material from the cryogenic heat sink and an intermediate cooling fluid circulated through a cooling loop; and exchanging thermal energy between the intermediate cooling fluid and the one or more electrical components to cool the one or more electrical components; and wherein the volume of cryogenic cooling material is configured to boil at a temperature below the superconducting temperature of the one or more electrical components.

13. The method of claim 12, further comprising periodically recharging the cryogenic heat sink.

14. The method of claim 13, wherein the recharging occurs when the aircraft is on the ground.

15. The method of claim 12, wherein the volume of cryogenic material is a primary propulsion fuel of the aircraft.

16. The method of claim 12, wherein the volume of cryogenic material is at a heat sink temperature lower than a superconducting temperature of the one or more electrical components.

* * * * *